(12) United States Patent
Or et al.

(10) Patent No.: US 9,177,780 B2
(45) Date of Patent: Nov. 3, 2015

(54) DIRECTIONAL SIO2 ETCH USING PLASMA PRE-TREATMENT AND HIGH-TEMPERATURE ETCHANT DEPOSITION

(71) Applicant: Applied Materials, Inc., Santa Clara, CA (US)

(72) Inventors: David T. Or, Santa Clara, CA (US); Joshua Collins, Sunnyvale, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/031,332

(22) Filed: Sep. 19, 2013

(65) Prior Publication Data
US 2014/0193979 A1 Jul. 10, 2014

Related U.S. Application Data

(60) Provisional application No. 61/709,107, filed on Oct. 2, 2012.

(51) Int. Cl.
*H01L 21/02* (2006.01)
(52) U.S. Cl.
CPC .......... *H01L 21/02057* (2013.01); *H01L 21/02* (2013.01)
(58) Field of Classification Search
None
See application file for complete search history.

(56) References Cited

U.S. PATENT DOCUMENTS

| 6,057,247 A | 5/2000 | Imai et al. |
| 6,153,512 A * | 11/2000 | Chang et al. ................. 438/624 |
| 2002/0072223 A1* | 6/2002 | Gilbert et al. ................. 438/629 |
| 2004/0222083 A1* | 11/2004 | Fan ............................. 204/192.3 |
| 2007/0123051 A1 | 5/2007 | Arghavani et al. |
| 2009/0275205 A1 | 11/2009 | Kiehlbauch et al. |
| 2010/0041212 A1 | 2/2010 | Jinzu et al. |
| 2010/0117163 A1* | 5/2010 | Miyashita ..................... 257/408 |
| 2010/0210099 A1* | 8/2010 | Hur et al. ...................... 438/586 |
| 2011/0223755 A1* | 9/2011 | Kao et al. ...................... 438/585 |
| 2011/0250747 A1* | 10/2011 | Son et al. ...................... 438/594 |

FOREIGN PATENT DOCUMENTS

KR 10-2006-0133606 12/2006

OTHER PUBLICATIONS

International Search Report and Written Opinion dated Dec. 27, 2013 for PCT/US2013/060195; 12 pages.

* cited by examiner

*Primary Examiner* — Shamim Ahmed
*Assistant Examiner* — Bradford Gates
(74) *Attorney, Agent, or Firm* — Patterson & Sheridan, LLP (57) ABSTRACT

Methods for processing a substrate are described herein. Methods can include positioning a substrate with an exposed surface comprising a silicon oxide layer in a processing chamber, biasing the substrate, treating the substrate to roughen a portion of the silicon oxide layer, heating the substrate to a first temperature, exposing the exposed surface of the substrate to a plasma comprising ammonium fluoride to form one or more volatile products while maintaining the first temperature, and heating the substrate to a second temperature, which is higher than the first temperature, to sublimate the volatile products.

20 Claims, 5 Drawing Sheets

DIRECTIONAL SIO2 ETCH USING PLASMA PRE-TREATMENT AND HIGH-TEMPERATURE ETCHANT DEPOSITION

CROSS-REFERENCE TO RELATED APPLICATIONS

This application claims benefit of U.S. Provisional Patent Application Ser. No. 61/709,107 (APPM/17909L), filed Oct. 2, 2012, which is herein incorporated by reference.

BACKGROUND OF THE INVENTION

1. Field of the Invention

Technology described herein relates to directional etching of native oxides. Specifically, technology described herein relates to pretreatment of an oxide surface to selectively etch horizontal surfaces during a deposition etch process.

2. Description of the Related Art

With the increase in transistor density and subsequent decrease in the cross-sectional dimensions of device nodes, which can be less than 22 nm, pre-clean of native oxides is of particular importance. Pre-clean can include pre-contact clean or pre-silicide clean which requires removal of oxides from vias or trenches of narrowing cross-sectional dimensions. As critical dimension of semiconductor devices decreases, distances between neighboring features formed on a semiconductor substrate are also shortened. Thus, it is important to control etching between vias and trenches during precleaning to prevent damaging nearby features.

Current precleaning techniques generally includes a conformal etch of the substrate to remove the native oxides, such as SiO2, prior to deposition of silicides or other contacts. However, a standard conformal etch can lead to excessive cross-sectional enlargement of vias and trenches thus creating possible leakage and ultimate device failure. Other precleaning techniques such as sputter etching can remove the native oxides from upper surfaces. However, the sputtering can lead to redeposition of the oxides at the via or trench opening. The redeposited oxides prevent subsequent deposition in the vias and trenches leading to poor subsequent contact fill.

Thus, methods are needed to preferentially etch from horizontal surfaces to prevent damage to features during precleaning.

SUMMARY OF THE INVENTION

Embodiments described herein generally relate to directional etching of native silicon oxides. In one embodiment, a method can include positioning a substrate with an exposed surface comprising a silicon oxide layer in a processing chamber; biasing the substrate; treating the substrate to roughen a portion of the silicon oxide layer; heating the substrate to a first temperature; exposing the exposed surface of the substrate to a plasma comprising ammonium fluoride ($NH_4F$) to form one or more volatile products; and heating the substrate to a second temperature, which is higher than the first temperature, to sublimate the volatile products.

In another embodiment, a method can include positioning a silicon-containing substrate in connection with a substrate support, the silicon-containing substrate comprising; an exposed surface; one or more microstructures formed in the exposed surface a native oxide layer formed on the exposed surface biasing the substrate; exposing the substrate to a low energy inert plasma to form amorphous silicon oxide on surface perpendicular to the flow of the low energy inert plasma; heating the substrate to a first temperature; exposing the surface of the substrate to a plasma comprising ammonium fluoride ($NH_4F$) to form one or more volatile products; and heating the substrate to a second temperature, which is higher than the first temperature, to sublimate the volatile products.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods for removing native oxides are described herein. Precleaning of surfaces in vias and trenches can lead to etching of sidewalls and subsequent reduction of cross sectional dimensions. This reduction of cross-sectional dimensions can lead to device failure. The embodiments described herein allow for directional etching of surfaces to remove native oxides from bottoms of vias and trenches while preserving the cross-sectional dimensions of the via or trench. By employing a directional pretreatment of the native oxide surface prior to conformal exposure to an etchant at elevated temperatures, the affected surface is prepared for preferential etching while the untreated surface is nominally etched due to equilibrium adsorption/desorption. The invention is more fully explained with reference to the figures below.

A processing chamber 100 suitable for conducting a precleaning process is further described below. The chamber 100 may be configured to remove native oxides or other contaminants from a substrate surface prior to forming a pre-contact layer or metal silicide layer on the substrate. The chamber 100 is particularly useful for performing the plasma assisted dry etch process (i.e., the "preclean process"). The processing chamber 100 may be a Preclean PCII, PCXT or Siconi chambers which are available from Applied Materials, Santa Clara, Calif. It is noted that other vacuum chambers available from other manufactures may also be utilized to practice the present invention.

Figure 1:
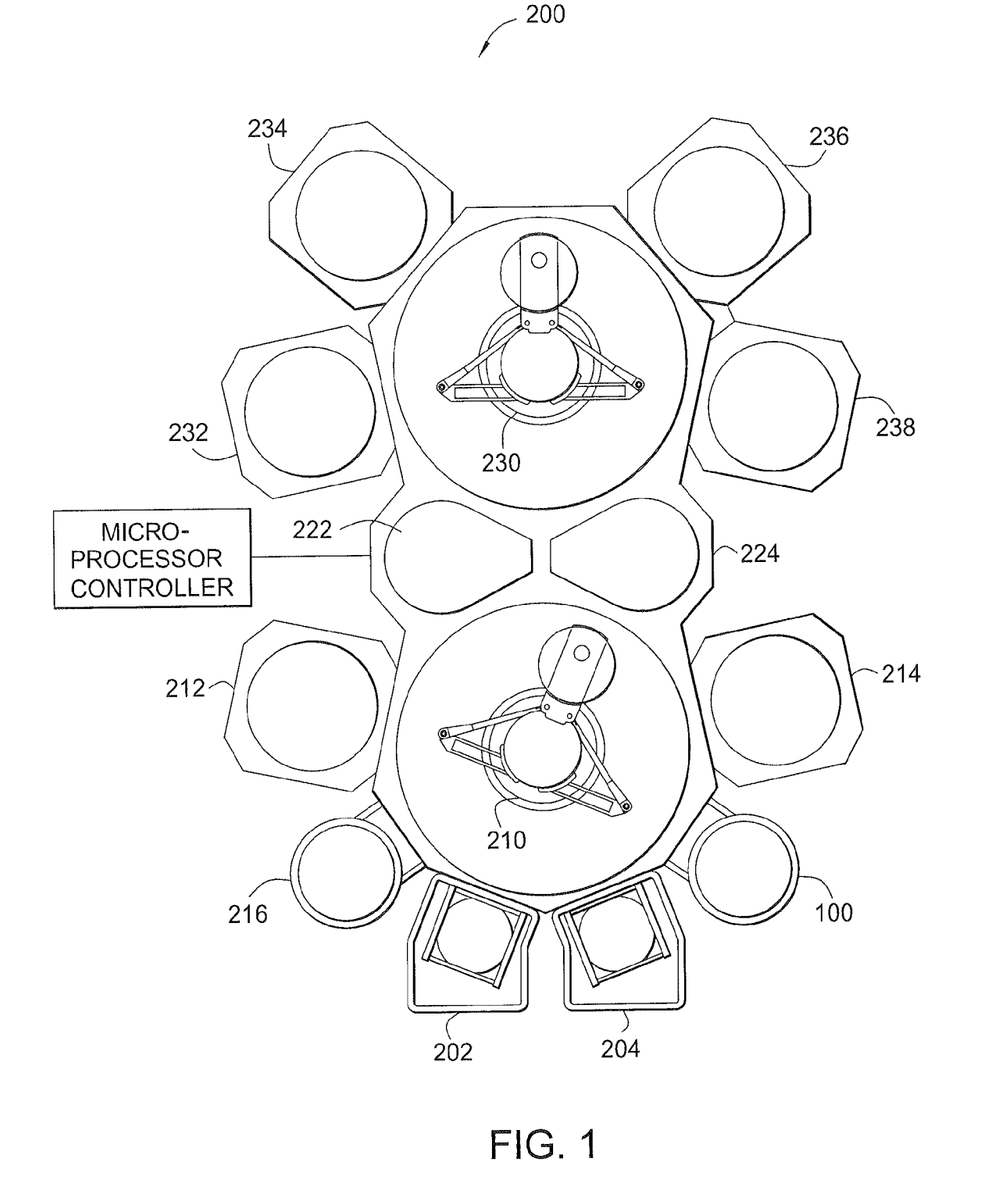
FIG. 1 is a schematic top-view diagram of an illustrative multi-chamber processing system useable with embodiments described herein.

FIG. 1 is a schematic top-view diagram of an illustrative multi-chamber processing system 200 that can be adapted to perform processes as disclosed herein having the processing chamber 100 coupled thereto. The system 200 can include one or more load lock chambers 202, 204 for transferring substrates into and out of the system 200. Typically, since the system 200 is under vacuum, the load lock chambers 202, 204 can "pump down" the substrates introduced into the system 200. A first robot 210 can transfer the substrates between the load lock chambers 202, 204, and a first set of one or more substrate processing chambers 212, 214, 216, 100 (four are shown). Each processing chamber 212, 214, 216, 100 is configured to perform at least one of substrate processing operations, such as cyclical layer deposition (CLD), atomic layer deposition (ALD), chemical vapor deposition (CVD), physical vapor deposition (PVD), etch, degas, orientation and other substrate processes. The position of the processing chamber 100 utilized to perform the preclean process relative to the other chambers 212, 214, 216 us for illustration, and the position of the processing chamber 100 may be optionally be switched with any one of the processing chambers 212, 214, 216 if desired.

The first robot 210 can also transfer substrates to/from one or more transfer chambers 222, 224. The transfer chambers 222, 224 can be used to maintain ultrahigh vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 214, 216, 100, the processing chambers 232, 234, 236, 238 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 212, 214, 216, 100, 232, 234, 236, 238 can be removed from the system 200 if not necessary for a particular process to be performed by the system 200.

After the preclean process is formed in the processing chamber 100, the substrate may further be transferred to any of the processing chambers 212, 214, 216, 232, 234, 236, 238 disposed in the system 200 to perform other process, such as a metal layer deposition or metal silicide layer fabrication process.

Figure 2:
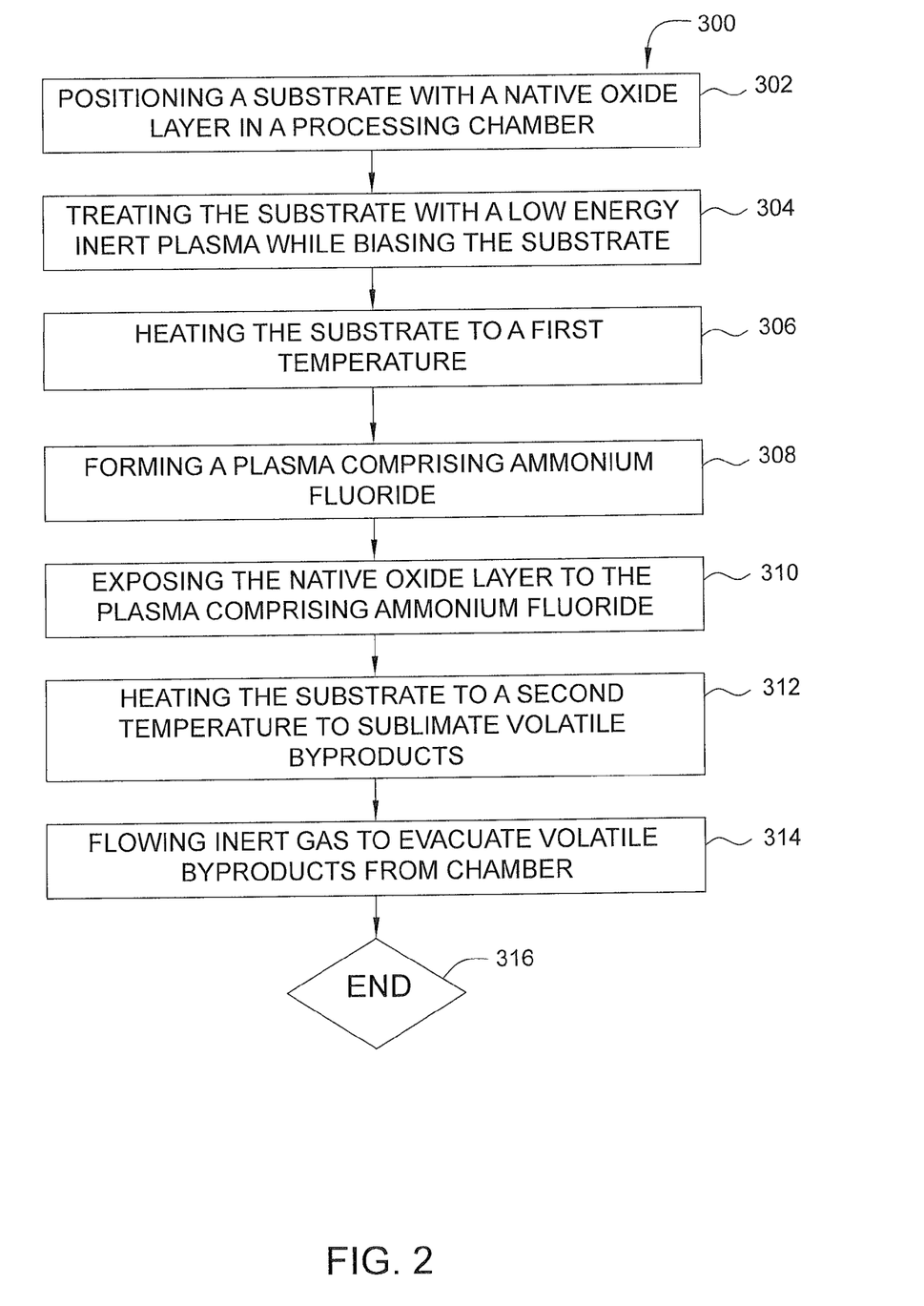
FIG. 2 is a diagram of a method for directional etching according to one embodiment.

FIG. 2 is a diagram of a method for directional etching according to one embodiment. The method 300 can include positioning a substrate with a native oxide layer in the processing chamber, as in 302. The processing chamber can be a processing chamber 100 as described with reference to FIG. 1 or it can be a different processing chamber. The processing chamber should be capable of at least maintaining the substrate at a specific temperature, biasing the substrate and creating a plasma. The substrate can be a silicon substrate with features formed on the surface. The features can include one or more of vias and trenches of varying cross-sectional dimensions, such as less than 22 nm. Native oxides may be formed on one or more of the surfaces of the substrate, such as a silicon dioxide formed on all exposed surfaces. The native oxides may also be of varying thickness dependant on the circumstances of formation, such as exposure to the atmosphere.

The method 300 can further include treating the substrate with a low energy inert plasma while biasing the substrate, as in 304. The inert plasma can comprise any inert gas. Inert gases include noble gases, such as helium or argon. The inert plasma is formed into a plasma of sufficiently low energy so as to not sputter the substrate. Stated another way, the inert plasma is a primarily ionized species so that the directionality is random. The inert plasma may be either formed remotely in a plasma chamber and delivered to the chamber or formed inside the chamber itself.

The inert plasma is flowed toward the substrate which is simultaneously biased. The bias on the substrate can be of any power level which will not promote sputtering, such as between 25 W and 200 W. The bias can be delivered at varying frequencies, such as a bias of 13 Mhz, 13.56 Mhz, 60 Mhz or combinations thereof. As previously disclosed, the inert plasma is a low energy plasma which is largely ionized, thus having a random directional movement. The bias applied to the substrate attracts the ionized gas in the plasma toward the substrate, where the ionized gas strikes surfaces which are perpendicular to the direction of ionized gas movement, such as the bottom of a via or trench on a substrate. The ionized gas thus changes the surface by various mechanisms, including mechanical roughening, forming dangling bonds at surface, reduced density surfaces, formation of amorphous surfaces. These surface changes prepare the surface for subsequent directional etching.

The method 300 can further include forming a plasma comprising ammonium fluoride ($NH_4F$) to etch the substrate, as in 308. An $NH_4F$ etching is a dry etch process for removing one or more silicon oxides using an ammonia ($NH_3$) and nitrogen trifluoride ($NF_3$) gas mixture performed within a plasma processing chamber. The substrate is generally heated to a temperature above 65° C., such as between 65° C. and 100° C., by a heating apparatus formed within the support member. In one embodiment, the substrate is maintained at 70° C. In another embodiment, the substrate is maintained at a temperature of between 70° C. and 90° C.

An etching gas mixture is introduced to the chamber for removing silicon oxides on a surface of the substrate. In one embodiment, ammonia and nitrogen trifluoride gases are then introduced into the plasma chamber to form the etching gas mixture. The amount of each gas introduced into the plasma chamber is variable and may be adjusted to accommodate, for example, the thickness of the oxide layer to be removed, the geometry of the substrate being cleaned, the volume capacity of the plasma, the volume capacity of the chamber, as well as the capabilities of the vacuum system coupled to the chamber. The ratio of the etching gas mixture may be predetermined to remove various oxides on the substrate surface. The ratio of gas mixture in the etching gas mixture may be adjusted to preferentially remove the pre-treated oxides, such as native oxides formed on the horizontal surfaces. In one embodiment, molar ratio of ammonia to nitrogen trifluoride in the etching gas mixture may be set to uniformly remove silicon oxides.

In one embodiment, etching rate of the etching gas mixture may be adjusted by adjusting a flow rate of nitrogen trifluoride while maintaining a molar ratio of ammonia and nitrogen trifluoride above a predetermined value. In one embodiment, etching rate may be increased or decreased by increasing or decreasing the flow rate of nitrogen trifluoride while the ratio of ammonia and nitrogen trifluoride remains above about 3:1. In another embodiment, ratio of ammonia and nitrogen trifluoride can be about 1:1.

The ammonia and nitrogen trifluoride gases can be dissociated into reactive species in a remote plasma chamber. The dissociated species can combine to form a highly reactive ammonia fluoride ($NH_4F$) compound and/or ammonium hydrogen fluoride ($NH_4F.HF$) in the gas phase. These molecules react with the substrate surface to be processed. In one embodiment, the carrier gas is first introduced into the chamber, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F \cdot HF$, reacts with the silicon oxide surface to form ammonium hexafluorosilicate $(NH_4)_2SiF_6$, $NH_3$, and $H_2O$ products. The $NH_3$, and $H_2O$ are vapors at processing conditions and removed from the chamber by a vacuum pump. A thin film of $(NH_4)_2SiF_6$ is left behind on the substrate surface. This reaction mechanism can be summarized as follows:

$$NF_3 + 3NH_3 \rightarrow NH_4F + NH_4F \cdot HF + N_2$$

$$6NH_4F + SiO_2 \rightarrow (NH_4)_2SiF_6 + 2H_2O + 4NH_3$$

$$(NH_4)_2SiF_6 + heat \rightarrow 2NH_3 + 2HF + SiF_4$$

After the products are reacted, the non-reacted $NH_4F$ can be low pressure sublimated and removed from the chamber so as to not affect further processing.

The method 300 can further include removing the $(NH_4)_2SiF_6$ by heating the substrate to a second temperature to sublimate volatile byproducts, as in 312. After the thin film is formed on the substrate surface, the support member may be elevated to an anneal position in close proximity to a heated gas distribution plate. The heat radiated from the gas distribution plate may dissociate or sublimate the thin film of $(NH_4)_2SiF_6$ into volatile $SiF_4$, $NH_3$, and HF products. These volatile products are then removed from the chamber by the vacuum pump as described above. Typically, a temperature of 75° C. or more is used to effectively sublimate and remove the thin film from the substrate. Preferably, a temperature of 100° C. or more is used, such as between about 115° C. and about 200° C.

The method 300 can further include flowing inert gas to evacuate the volatile byproducts from the chamber, as in 314. The thermal energy to dissociate the thin film of $(NH_4)_2SiF_6$ into its volatile components is transferred by the gas distribution plate through convection or radiation. In one aspect, the distribution plate is heated to a temperature of between 100° C. and 150° C., such as about 120° C. Further embodiments use a low energy plasma, such as a plasma as described with reference to the pretreatment process, to enhance the sublimation of volatile byproducts. The plasma is delivered to the surface of the substrate uniformly and at an energy level which will not sputter the oxides form the substrate. By using a low energy plasma while simultaneously heating the substrate, it is believed that the activation energy for sublimation can be reduced. For example, a layer of $(NH_4)_2SiF_6$ may be of a certain thickness which requires a temperature of 120° C. over a certain time period to sublimate. By using a low energy plasma, the layer of $(NH_4)_2SiF_6$ can be sublimated at 100° C. over the same time period or at 120° C. over a shorter time period.

Once the film has been removed from the substrate, the process can be ended, as in 316. The processing chamber is purged and evacuated. The processed substrate is then removed from the chamber by lowering the substrate member to the transfer position, de-chucking the substrate, and transferring the substrate through a slit valve opening.

Without intending to be bound by theory, it is believed that at elevated temperatures, under normal conditions or on untreated surfaces, the chemical etch rate is practically zero because desorption rate equals absorption rate of the $NH_4F$ etchant. During a standard $NH_4F$ etch process, the substrate will be maintained at a temperature less than 40° C., such as a temperature between 25° C. and 40° C. In this temperature range, the reaction between the $NH_4F$ and the oxide layer on the substrate is believed to be reaction limited, such that higher levels of reactant will lead to increased and uniform etching of the oxide layer. When the temperature is raised above the dew point of $NH_4F$, the adsorption rate is closer to the desorption rate on conformal areas of silicon oxide. Therefore, the conformal areas of silicon oxide is not etched. The areas which have been pretreated with the inert plasma, however, are not conformal. As such, at temperatures from 65° C. to 100° C., and more preferably from 70° C. to 100° C., the silicon oxide is not etched in conformal areas (e.g. side walls of vias and trenches) and it is etched in pretreated areas (e.g. upper surface of the substrate and bottoms of trenches).

Important to note is that the etching process is further selective for etching of silicon oxide over other layers which may be disposed on the substrate during the etching process. $NH_4F$ etchant will etch silicon oxide without substantial etching of layers such as silicon nitride or metal silicides. The experimentally determined selectivity between SiO2 and SiN is greater than 7:1 and in some examples greater than 9:1. Thus, the above method provides for both selectivity and directionality in etching of native oxides.

Figure 3:
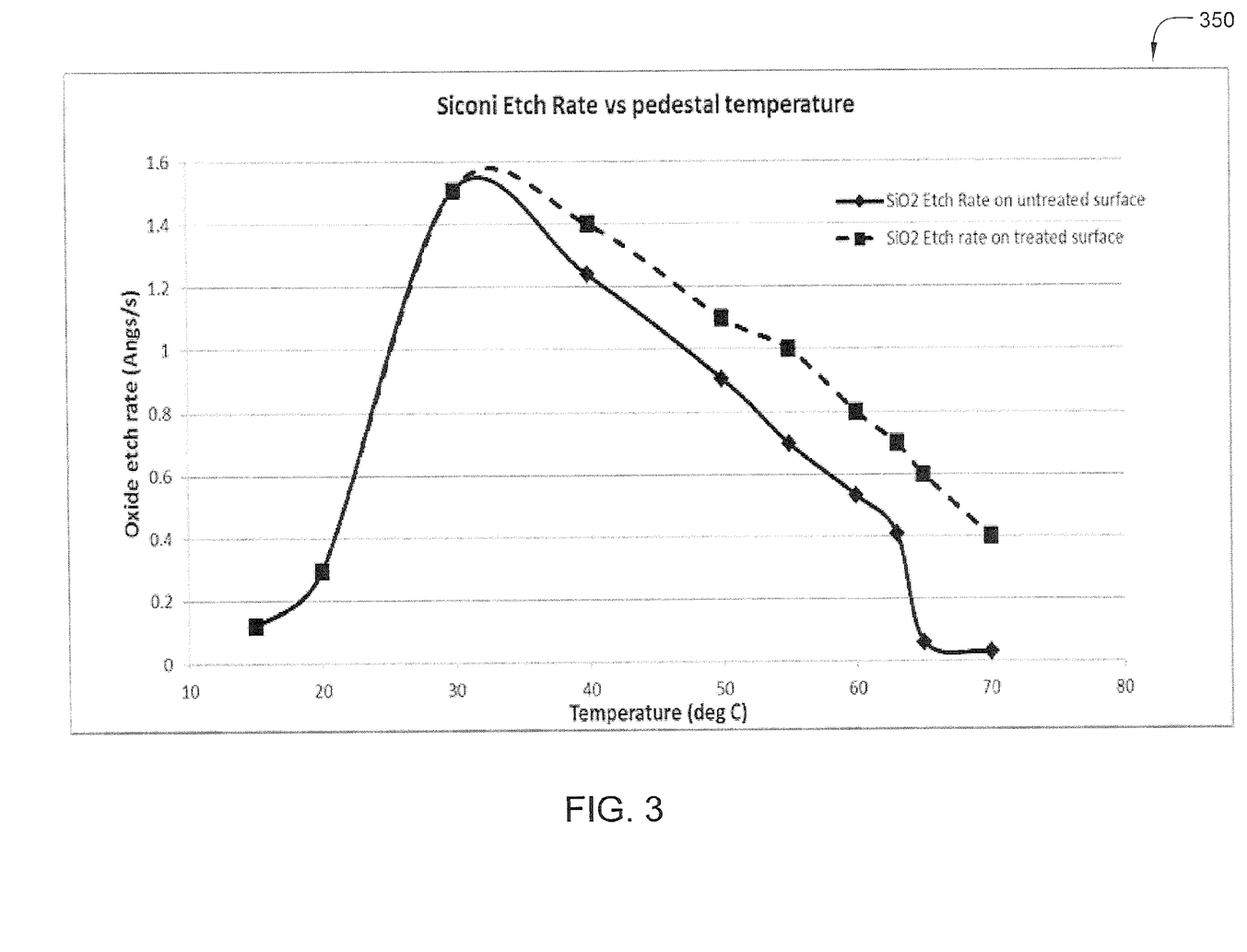
FIG. 3 depicts etch rate of the silicon oxide as a function of pedestal temperature according to one embodiment.

FIG. 3 depicts etch rate of the silicon oxide as a function of pedestal temperature according to one embodiment 350. A silicon substrate with a silicon oxide layer formed on the surface was positioned in a processing chamber and processed at each temperature level. The substrates were positioned on the substrate support and received a RF bias of 100 W, where the bias is optimally between 25 W and 200 W. A low energy (e.g. helium plasma formed at 100 W RF power) inert plasma was delivered to the biased substrate, pre-treating only the horizontal regions of the substrate. Inert plasma refers to a plasma which is not chemically reactive to $SiO_2$, such as Ar, He, $H_2$, $N_2$ or combinations thereof.

The pre-treated substrate was then treated with a plasma of the $NH_4F$ etchant at temperatures between 15° C. and 70° C. Etch rates were measured and plotted as shown in the graph with the oxide etch rate in A/sec. over temperature in degrees C. Treated and untreated regions showed no difference in temperatures between 15° C. and 30° C. From 30° C. to about 62° C. the treated surface was etched at a higher rate. However, both the treated and untreated surfaces show a linear decline in etch rate. The decline in etch rate after 30° C. is believed to be related to an increase in desorption of the $NH_4F$ from the surface of the substrate prior to the formation of $(NH_4)_2SiF_6$. The etch rate is believed to be higher on the pre-treated surface due to the topographical changes from the pre-treatment step. At temperatures higher that 62° C., the etch rate on the untreated surface is substantially lower than either the prior temperature untreated surface etch rate or the treated surface etch rate. It is believed that, at this temperature or above, the adsorption rate and the desorption rate are equal. Thus, a minimal amount of $(NH_4)_2SiF_6$ is formed on the untreated surfaces. Contrary to the untreated surfaces, the pre-treated surfaces continue to show a linear decline in etch rate but substantially higher than that of the untreated surfaces.

Figure 4A:
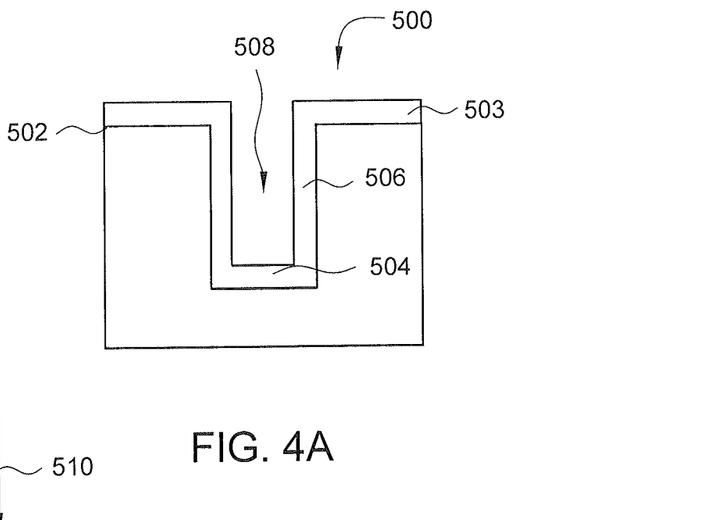
FIGS. 4A-4C are graphical representations of a substrate etched according to one or more embodiments.
Figure 4B:
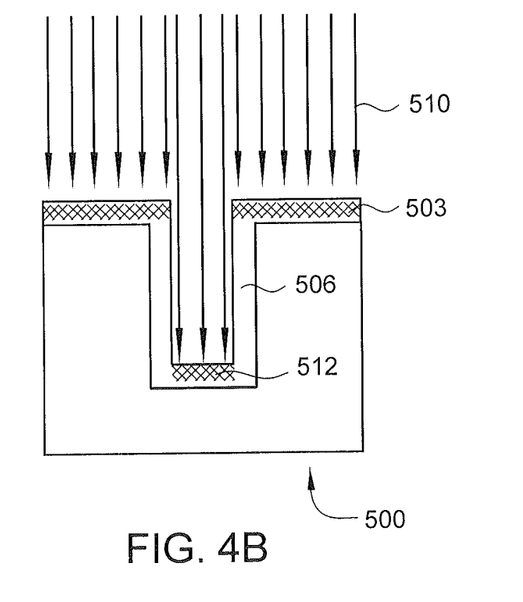
Figure 4C:
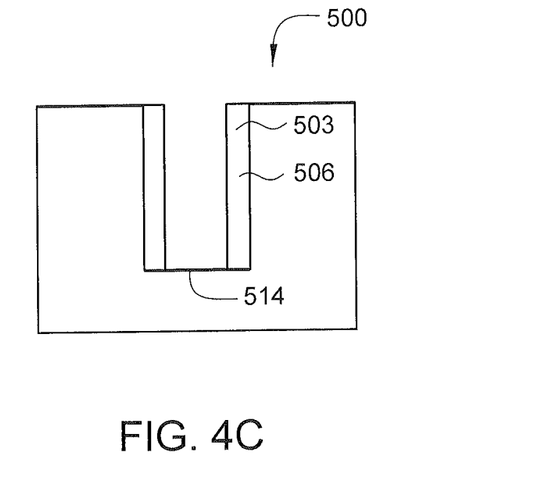

FIGS. 4A-4C are graphical representations of a substrate 500 etched according to one or more embodiments. FIG. 4A depicts a substrate 500 with a native oxide layer 503 according to one embodiment. The substrate 500 can be a silicon-containing substrate, such as a crystalline silicon substrate. The substrate 500 has an upper surface 502. The upper surface 502 has a native oxide layer 503 formed thereon, such as a silicon oxide layer formed on a silicon-containing substrate. The native oxide layer 503 can be a result of transfer between chambers (i.e. exposure to atmosphere). The substrate 500 can further have vias and trenches formed therein, such as a via 508. The native oxide layer 503 can be separated into two distinct regions, such as horizontal layers 504 and vertical layers 506. The substrate 500 can be positioned in a processing chamber as described above.

FIG. 4B depicts a substrate 500 during plasma pre-treatment according to one embodiment. The substrate 500 is treated with a low energy inert plasma 510, as described with reference to the embodiments above. The plasma 510 can alter the horizontal surfaces 512 without altering the vertical surfaces 506. The bias in the substrate 500 provides directionality to the low energy inert plasma. The bias delivered to the substrate can be between 25 W and 200 W.

FIG. 4C depicts the substrate 500 after etching with the $NH_4F$ etchant, according to one embodiment. The substrate 500 is heated to a second temperature, such as a temperature higher than 62° C. The substrate 500 is then treated with the previously formed $NH_4F$ etchant. The $NH_4F$ etchant adsorbs preferentially into the horizontal (pre-treated) surfaces 512 with very little adsorbing to the vertical (untreated) surfaces 506. After the $(NH_4)_2SiF_6$ film is formed on and from the horizontal surfaces 512, the substrate is annealed to sublimate the $(NH_4)_2SiF_6$ film thus exposing the cleaned surfaces 514. The thickness and composition of vertical surfaces 506 are substantially unchanged.

It is believed that the high temperature applied to the substrate 500 during the $NH_4F$ plasma treatment further assists in etching by enhancing sublimation. As the temperature that the substrate is maintained at is very close to the temperature which the $(NH_4)_2SiF_6$ film is believed to sublimate, the film is expected to be partially sublimating as it is formed on the pretreated surfaces. Therefore, less annealing is necessary while simultaneously exposing more of the surface to $NH_4F$ etchant.

Figure 5A:
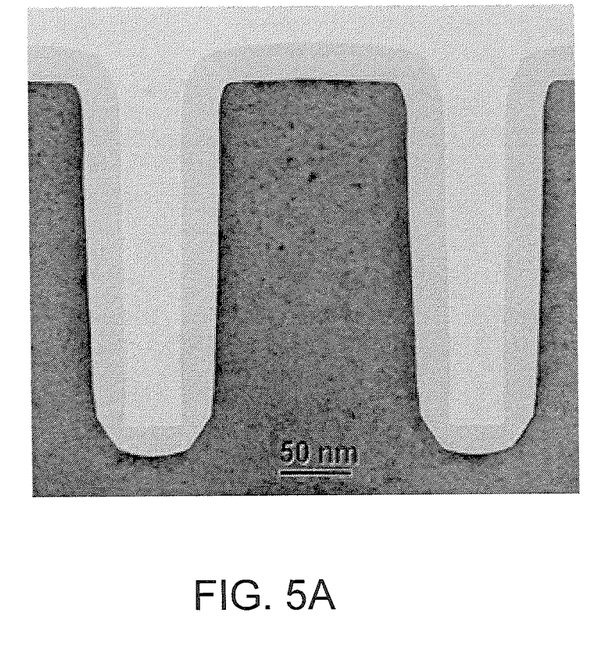
FIGS. 5A and 5B show transmission electron microscope (TEM) views of a substrate directionally etched as described herein.
Figure 5B:
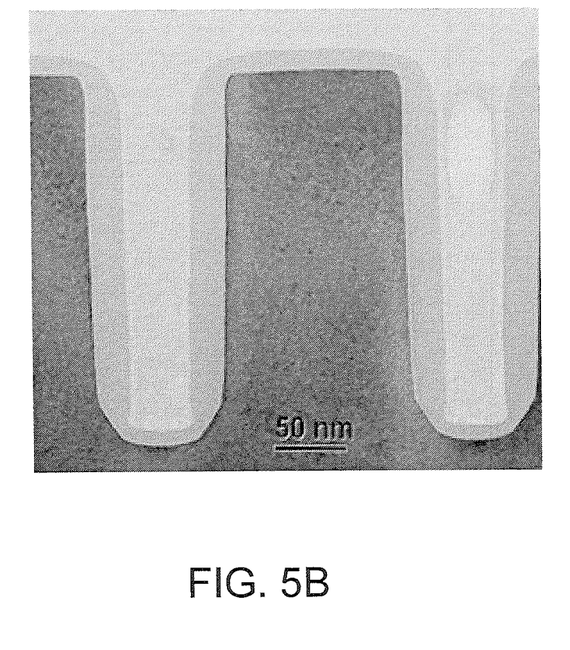

FIGS. 5A and 5B show transmission electron microscope images. FIG. 5A shows a silicon substrate with two vias formed therein. Disposed over the surface of the silicon substrate is a conformal layer of silicon oxide approximately 13 Å thick as formed by native oxidation. The silicon substrate was pretreated with a low energy inert plasma comprising 100 mTorr of Argon. Conditions for the plasma were optimized to avoid sputtering of the silicon oxide layer. The substrate received a 50 W bias at 13.56 Mhz during the plasma treatment and the plasma was delivered over 10 seconds. Post-inert plasma treatment, the substrate was exposed to $NH_4F$ plasma formed in a remote plasma source. The substrate was maintained at a temperature of 75° C. during the treatment with $NH_4F$ plasma. The $(NH_4)_2SiF_6$ film was formed on the pretreated surfaces and sublimated from the surface of the substrate during a post-treatment anneal at 120° C.

FIG. 5B shows the same silicon substrate with the directional etching of horizontal surfaces according to the above embodiment. The substrate shows substantial difference in etch rates between horizontal surfaces and vertical surfaces. The bottom etch amount was 91 Å which closely correlates to the slightly higher etch rate of 106 Å on the upper surfaces. The side walls were etched from 5 Å at the top side wall to 0 Å at the mid side wall. The determined etch rates show at least a 10:1 preferential etching of the bottom and top horizontal surfaces over the vertical surfaces.

Conclusion

Embodiments described herein relate to methods of directional removal of native oxides form a surface. Above embodiments show preferential etching of pretreated surfaces over untreated surfaces. $SiO_2$ is formed natively on silicon surfaces and must be removed for proper deposition in vias and trenches. However, it is important to avoid changing the cross-sectional dimensions of the modern day vias and trenches, which can lead to device failure. By pretreating a biased substrate with a low energy inert plasma, the horizontal surfaces will be roughened and amorphousized. Thus, a chemical etch by $NH_4F$ plasma at a high temperature will be effective for removing the pre-treated $SiO_2$ without affecting the untreated $SiO_2$ on the side walls of the vias or trenches.

While the foregoing is directed to embodiments of the present invention, other and further embodiments of the invention may be devised without departing from the basic scope thereof, and the scope thereof is determined by the claims that follow.

What is clamed is:

1. A method, comprising:
positioning a substrate in a processing chamber, the substrate comprising:
a patterned layer having an upper surface and one or more features formed in the patterned layer, the one or more features having a bottom surface and a side surface; and
an oxide layer formed on the upper surface, the bottom surface, the side surface, or combinations thereof;
while biasing the substrate, exposing the substrate to an inert plasma to selectively form a pretreated surface on the oxide layer formed over the upper surface and the bottom surface, wherein the oxide layer formed over the upper surface and the bottom surface is selectively roughened;
after exposing the substrate to the inert plasma, heating the substrate to a first temperature;
exposing the substrate to a processing gas comprising ammonium fluoride ($NH_4F$) or $NH_4F(HF)$, wherein the processing gas reacts with the oxide layer to form one or more volatile products on the upper surface and the bottom surface, and wherein the processing gas reacts preferentially with the oxide layer on the upper surface and the bottom surface, the substrate being maintained at the first temperature; and
heating the substrate to a second temperature, which is higher than the first temperature, to sublimate the one or more volatile products.

2. The method of claim 1, wherein the features are vias or trenches.

3. The method of claim 1, wherein the first temperature is a temperature of at least 65° C.

4. The method of claim 1, wherein the first temperature is a temperature of between 70° C. and 90° C.

5. The method of claim 1, wherein the second temperature is a temperature of greater than 100° C.

6. The method of claim 1, wherein heating the substrate to a second temperature further comprises exposing the oxide layer to an inert plasma.

7. The method of claim 1, wherein a plasma comprising ammonium fluoride is formed remotely.

8. The method of claim 1, wherein the processing gas comprising ammonium fluoride is formed by reacting ammonia ($NH_3$) and nitrogen trifluoride ($NF_3$).

9. The method of claim 8, wherein a 1:1 ratio of ammonia ($NH_3$) and nitrogen trifluoride ($NF_3$) is used to form the ammonium fluoride.

10. The method of claim 8, wherein the a 3:1 ratio of $NH_3$ to $NF_3$ or higher is used to form the ammonium fluoride.

11. A method, comprising:
positioning a silicon-containing substrate in a processing chamber, the silicon-containing substrate comprising:
a first surface;

one or more features formed in the first surface, the features having a bottom surface and a side surface; and an oxide layer formed on the first surface, the bottom surface, the side surface or combinations thereof;

biasing the substrate;

exposing the substrate to an inert plasma to selectively form a roughened surface from the portions of the oxide layer of the first surface perpendicular to the flow of the inert plasma;

heating the substrate to a first temperature;

exposing the surface of the substrate to a plasma comprising ammonium fluoride ($NH_4F$), wherein the $NH_4F$ reacts with the oxide layer to form one or more volatile products, and wherein the $NH_4F$ reacts preferentially with the oxide layer on the roughened surface of the first surface; and heating the substrate to a second temperature, which is higher than the first temperature, to sublimate the volatile products.

12. The method of claim 11, wherein the first temperature and the second temperature are within 10° C. of one another.

13. The method of claim 11, wherein the first temperature is a temperature of at least 65° C.

14. The method of claim 11, wherein the first temperature is a temperature of between 70° C. and 90° C.

15. The method of claim 11, wherein the second temperature is a temperature of greater than 100° C.

16. The method of claim 11, wherein heating the substrate to a second temperature further comprises exposing the first surface of the substrate to a second inert plasma.

17. The method of claim 11, wherein the plasma comprising ammonium fluoride is formed remotely.

18. The method of claim 11, wherein the plasma comprising ammonium fluoride is formed using a gas mixture comprising ammonia ($NH_3$) and nitrogen trifluoride ($NF_3$).

19. The method of claim 18, wherein the gas mixture is a 1:1 ratio of ammonia ($NH_3$) and nitrogen trifluoride ($NF_3$) respectively.

20. The method of claim 11, wherein the plasma comprising ammonium fluoride is a non-sputtering plasma.

* * * * *